United States Patent
Fujioka et al.

(10) Patent No.: US 7,830,433 B2
(45) Date of Patent: Nov. 9, 2010

(54) AMPLIFICATION TYPE SOLID STATE IMAGING DEVICE

(75) Inventors: Takashi Fujioka, Hyogo (JP);
Masayuki Masuyama, Kyoto (JP);
Makoto Inagaki, Kyoto (JP)

(73) Assignee: Panasonic Corporation, Osaka (JP)

( * ) Notice: Subject to any disclaimer, the term of this patent is extended or adjusted under 35 U.S.C. 154(b) by 532 days.

(21) Appl. No.: 11/568,565

(22) PCT Filed: Jul. 27, 2005

(86) PCT No.: PCT/JP2005/013732

§ 371 (c)(1),
(2), (4) Date: Nov. 1, 2006

(87) PCT Pub. No.: WO2006/048965

PCT Pub. Date: May 11, 2006

(65) Prior Publication Data

US 2008/0231733 A1 Sep. 25, 2008

(30) Foreign Application Priority Data

Nov. 5, 2004 (JP) ............................. 2004-322618

(51) Int. Cl.
*H04N 3/14* (2006.01)
*H04N 5/335* (2006.01)
*H01L 27/00* (2006.01)
*H01L 31/062* (2006.01)
*H01L 31/113* (2006.01)

(52) U.S. Cl. ...................... 348/294; 348/311; 348/302; 250/208.1; 257/294; 257/435

(58) Field of Classification Search ................. 348/294; 257/278, 291; 250/208.1
See application file for complete search history.

(56) References Cited

U.S. PATENT DOCUMENTS

| 5,061,978 | A | * | 10/1991 | Mizutani et al. ............ 257/659 |
| 5,115,293 | A |   | 5/1992 | Murayama et al. |
| 6,043,115 | A | * | 3/2000 | Pan ............................. 438/199 |

(Continued)

FOREIGN PATENT DOCUMENTS

JP 61-85860 5/1986

(Continued)

*Primary Examiner*—Sinh Tran
*Assistant Examiner*—Christopher K Peterson
(74) *Attorney, Agent, or Firm*—Hamre, Schumann, Mueller & Larson, P.C.

(57) ABSTRACT

An amplification type solid state imaging device in use includes at least a light-receiving portion 10 formed by arranging on a semiconductor substrate 7 one-dimensionally or two-dimensionally a plurality of pixels that convert incident light to signal charge and output electric signals corresponding to the amount of the signal charge, a reader for reading out sequentially the electric signals from the respective pixels, a noise rejection circuit 11 for suppressing spurious signals for the electric signals read out by the reader, and a first light-shielding layer 1 positioned on the upper part of the light-receiving portion 10 so as to restrict entry of light into parts other than photoelectric conversion portions 10a of the pixels. Furthermore, a second light-shielding layer 2 for restricting entry of light into the noise rejection circuit 11 is provided on the upper part of the noise rejection circuit 11.

8 Claims, 12 Drawing Sheets

U.S. PATENT DOCUMENTS

| | | |
|---|---|---|
| 6,403,998 B1 | 6/2002 | Inoue |
| 6,498,622 B1 * | 12/2002 | Nakashiba ................ 348/308 |
| 6,878,977 B1 | 4/2005 | Kozuka et al. |
| 7,030,918 B1 * | 4/2006 | Nakashiba ................ 348/294 |
| 7,151,305 B2 * | 12/2006 | Kozuka et al. ............. 257/431 |
| 2004/0021788 A1 | 2/2004 | Shizukuishi |

FOREIGN PATENT DOCUMENTS

| | | |
|---|---|---|
| JP | 3-181169 | 8/1991 |
| JP | 2000-150848 | 5/2000 |
| JP | 2000-311997 | 11/2000 |
| JP | 2001-015725 | 1/2001 |
| JP | 2004-64410 | 2/2004 |

* cited by examiner

AMPLIFICATION TYPE SOLID STATE IMAGING DEVICE

TECHNICAL FIELD

The present invention relates to an amplification type solid state imaging device.

BACKGROUND ART

A layout of a conventional amplification type solid state imaging device will be described below with reference to FIG. 10. As shown in FIG. 10, the amplification type solid state imaging device is configured by forming a light-receiving portion 112, a horizontal scanner 114, a vertical scanner 115 and a noise rejection circuit 120 on a semiconductor substrate 117 (see Patent Document 1, for example).

The light-receiving portion 112 is configured by arranging a plurality of pixels one-dimensionally or two-dimensionally. Each pixel has a photoelectric conversion portion 112a for converting incident light to a signal charge and an outputting portion (not shown) for outputting an electric signal corresponding to the amount of the signal charge. In the example as shown in FIG. 10, the pixels are arranged two-dimensionally.

A light-shielding layer 111 is provided on the upper part of the light-receiving portion 112. Opening windows 116 are formed in the light-shielding layer 111 so that light will enter the respective photoelectric conversion portions 112a. As a result, light enters only the photoelectric conversion portions 112a of the respective pixels, while entry of light into the remaining part of each pixel will be restricted. The opening windows 116 are formed by forming a film to cover the light-receiving portion 112 and by removing the film partially and selectively.

The light-shielding layer 111 is formed also by forming a film of an electroconductive material. Furthermore, a wiring 118 is connected to the light-shielding layer 111. The wiring 118 is applied with a voltage (Vsd) for providing a ground potential (GND) so as to stabilize the well of the light-receiving portion 112.

The horizontal scanner 114 and the vertical scanner 115 read out sequentially electric signals generated at the respective pixels of the light-receiving portion 112 in an X-Y addressing scheme. Specifically, the vertical scanner 115 performs selection and control in the row direction at the plural pixels. The pixel signals of the row selected by the vertical scanner 115 are outputted to the noise rejection circuit 120. The pixel signals outputted to the noise rejection circuit 120 are outputted for each pixel due to a drive of a horizontal selection transistor 129 (see FIG. 11) by the horizontal scanner 114.

As shown in FIG. 10, a wiring layer 113 is arranged between the noise rejection circuit 120 and the light-receiving portion 112. The wiring layer 113 is used for an output control when the pixel signals of the row selected by the vertical scanner 115 are outputted to the horizontal scanner 114. Specifically, the presence/absence of the outputting is decided on the basis of the level of the voltage (Vnc) applied from the wiring 119 to the wiring layer 113. This will be described more specifically with reference to FIG. 11 below.

The noise rejection circuit 120 is provided in a region between the light-receiving portion 112 and the horizontal scanner 114 on the semiconductor substrate 117, and it suppresses spurious signals for the pixel signals read out from the light-receiving portion 112. Specifically, the noise rejection circuit 120 suppresses and rejects noise caused by a dispersion of the amplifying transistors (not shown) that form the respective pixels.

Here, the configurations of the light-receiving portion 112 and the noise rejection circuit 120 as shown in FIG. 10 will be described specifically with reference to FIGS. 11A and 11B. FIGS. 11A and 11B are diagrams showing one example of a unit pixel and a noise rejection circuit. FIG. 11A is a circuit diagram of a unit pixel and a noise rejection circuit, and FIG. 11B is a timing chart of pulse signals applied to signal lines. The noise rejection circuit 120 is formed of a plurality of unit circuits arranged horizontally. FIG. 11A shows only one of the unit circuits forming the noise rejection circuit 120.

In FIG. 11A, 135, 136 and 123 denote a row reset line, a row selection line and a vertical signal line respectively. A reset signal RS is inputted to the row reset line 135. A signal TR is inputted to the row selection line 136. As shown in FIG. 11A, the unit pixel 131 includes a photodiode 132 and three transistors. Among the three transistors, 133 denotes a transfer transistor and 134 denotes an amplifying transistor.

The noise rejection circuit (unit circuit) 120 includes a clamping capacitor ($C_{CL}$) 125, a sampling capacitor ($C_{SP}$) 128, a vertical-signal-line noise-rejection-circuit connection transistor 124, and a clamping transistor 126. The vertical-signal-line noise-rejection-circuit connection transistor 124 is used for switching signal transmission from the vertical signal line 123 to the noise rejection circuit 120, and it has a gate electrode to which an input signal SP is inputted. The clamping transistor 126 has a gate electrode to which an input signal CL is inputted. In FIG. 11A, 129 denotes a horizontal selection transistor.

In FIG. 11B, 141 denotes a horizontal blanking period, and 142 denotes a horizontal signal outputting period. As shown in FIG. 11B, in the first half and the latter half of the horizontal blanking period 141, the noise rejection circuit 120 allows the clamping capacitor ($L_{CL}$) 125 to clamp a pixel signal outputted from a pixel and a reset signal RS by using pulses of the input signal CL and the input signal SP, and allows the sampling capacitor ($C_{SP}$) 128 to sample. As a result, since subtraction of the pixel signal and the reset signal RS is performed by the sampling capacitor ($C_{SP}$) 128, noise will be suppressed and rejected.

FIG. 12 shows a cross section of the amplification type solid state imaging device as shown in FIG. 10. In FIG. 12, the same components as those in FIG. 10 or FIG. 11 are assigned with the same reference numbers. In FIG. 12, parts provided with the same hatching patterns indicate that the parts have substantially the same functions.

In FIG. 12, numerals 121, 122 and 127 denote an element isolation region, an active region and a contact plug respectively. Numerals 130a-130c denote polysilicon wirings laid out in a plane, 137 denotes an insulating layer, and 138 denotes a well. In FIG. 12, the semiconductor substrate 117 and the insulating layer 137 are indicated without hatching.

As shown in FIG. 12, in the noise rejection circuit 120, the wiring layer 113 is connected via the contact plug 127 to the active region 122 in the vicinity of the sampling capacitor 128. The voltage (Vnc) applied to the wiring layer 113 provides a GND potential to the sampling capacitor 128. Therefore, by changing the voltage (Vnc) applied to the wiring layer 113, switching can be carried out at the time of transferring signals from the respective pixels 131 to the horizontal scanner 114 through the noise rejection circuit 120.

Patent document 1: JP 2001-15725 A

DISCLOSURE OF INVENTION

Problem to be Solved by the Invention

In the conventional amplification type solid state imaging device as shown in FIGS. 10-12, as mentioned above, a light-shielding layer 111 is provided on the upper part of the light-receiving portion 112 in order to restrict the entry of unnecessary light into the light-receiving portion 112. Such a light-shielding layer is not provided on the parts other than the light-shielding portion 112 (e.g., the noise rejection circuit 120), on which photoelectric conversion portions such as photodiodes are not formed.

However, as shown in FIG. 12, the noise rejection circuit 120 includes capacitors (for example, the clamping capacitor 125 and the sampling capacitor 128) that use PN junction capacitance and gate capacitance in a MOS transistor. The noise rejection circuit 120 also includes ordinary MOS transistors (for example, the clamping transistor 126 and the horizontal selection transistor 129).

Therefore, when light enters the noise rejection circuit 120, photoelectric conversion occurs at the PN junction in the noise rejection circuit 120 so as to generate a current. Furthermore, the thus generated current will affect the noise rejection performance at some parts, thereby causing a problem of degradation in the image quality.

Therefore, with the foregoing in mind, it is an object of the present invention to provide an amplification type solid state imaging device that can solve the above-identified problems and suppress degradation in the image quality.

Means for Solving Problem

For achieving the above-mentioned object, an amplification type solid state imaging device according to the present invention includes at least: a light-receiving portion formed by arranging on a semiconductor substrate one-dimensionally or two-dimensionally a plurality of pixels that convert incident light to signal charge and output electric signals corresponding to the amount of the signal charge; a reader for reading out sequentially the electric signals from the respective pixels; a noise rejection circuit for suppressing spurious signals for electric signals read out by the reader; and a first light-shielding layer that is positioned on the upper part the light-receiving portion in order to restrict entry of light into parts of the light-receiving portion other than the part for performing the photoelectric conversion, and the amplification type solid state imaging device is characterized in that a second light-shielding layer is provided on the upper part of the noise rejection circuit for restricting the entry of light into the noise rejection circuit.

EFFECTS OF THE INVENTION

Since the amplification type solid state imaging device of the present invention includes a light-shielding layer covering a noise rejection circuit, harmful light entering the noise rejection circuit can be shielded. Therefore, in the amplification type solid state imaging device of the present invention, degradation in image quality caused by generation of photoelectric conversion in the noise rejection circuit can be suppressed.

BRIEF DESCRIPTION OF DRAWINGS

FIG. 11A is a circuit diagram of a unit pixel and a noise rejection circuit, and FIG. 11B is a timing chart of pulse signals applied to signal lines.

DESCRIPTION OF THE INVENTION

Figure 1:
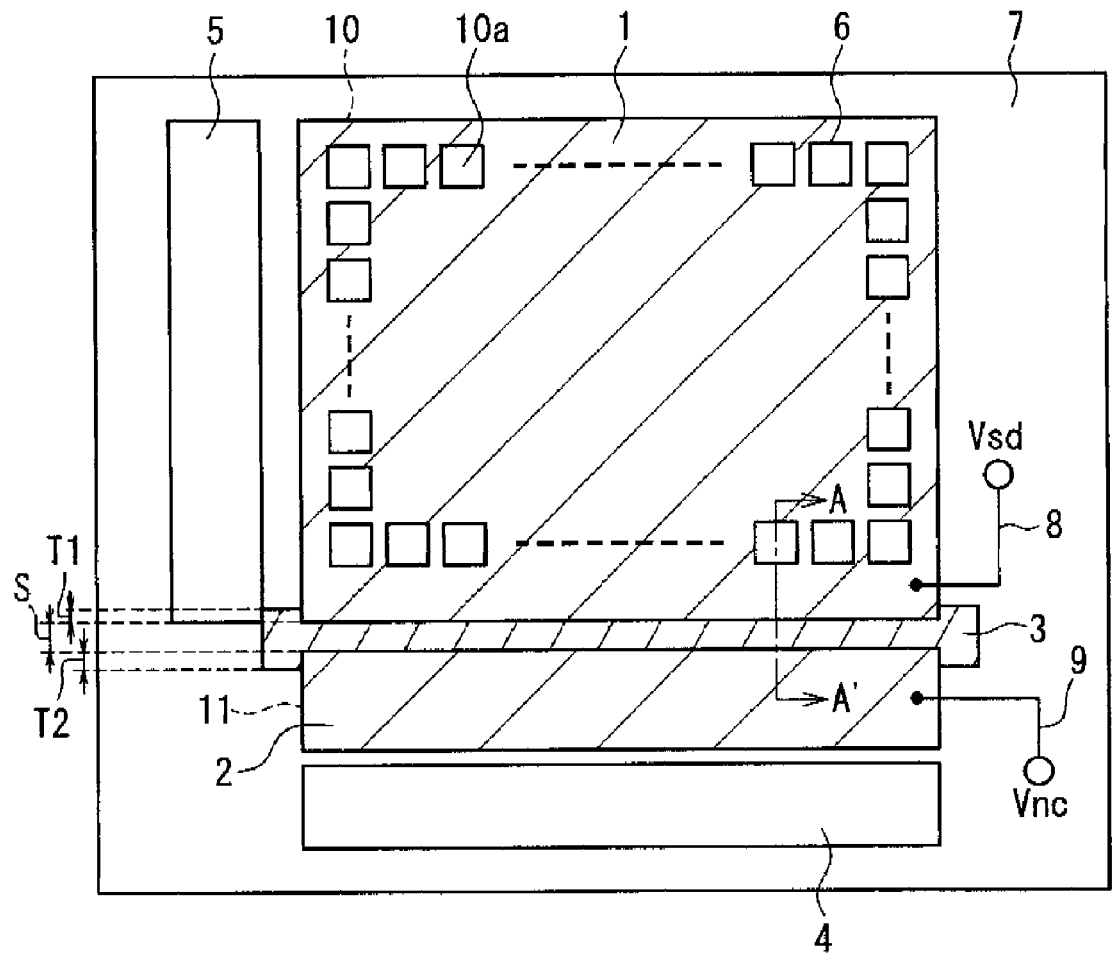
FIG. 1 is a schematic view showing a layout of an amplification type solid state imaging device according to a first embodiment of the present invention.

An amplification type solid state imaging device according to the present invention includes at least: a light-receiving portion formed by arranging on a semiconductor substrate one-dimensionally or two-dimensionally a plurality of pixels that convert incident light to signal charge and output electric signals corresponding to the amount of the signal charge; a reader for reading out sequentially the electric signals from the respective pixels; a noise rejection circuit for suppressing spurious signals for the electric signals read out by the reader; and a first light-shielding layer positioned on the upper part of the light-receiving portion so as to restrict entry of light into the light-receiving portion other than a part for photoelectric conversion, wherein a second light-shielding layer for restricting entry of light into the noise rejection circuit is provided on the upper part of the noise rejection circuit.

It is preferable in the amplification type solid state imaging device of the present invention that the reader has a vertical scanner provided along a column direction of the pixels and a horizontal scanner provided along a row direction of the pixels, the noise rejection circuit is provided in a region between the light-receiving portion and the horizontal scanner on the semiconductor substrate, and the first light-shielding layer and the second light-shielding layer are formed separately from each other. It is also preferable that the first light-shielding layer and the second light-shielding layer have electroconductivity, wirings for applying voltages separately to the first light-shielding layer and the second light-shielding layer are provided, and the second light-shielding layer is used for an output control at the time of outputting the electric signals read out by the reader to the noise rejection circuit.

In the above-mentioned embodiment, since pulses or DC biases can be applied separately to the first light-shielding layer and the second light-shielding layer, voltages can be applied to the light-receiving portion and the noise rejection circuit respectively as required for each of the light-receiving portion and the noise rejection circuit. Moreover, when pulses or DC biases are applied separately to the first light-shielding layer and the second light-shielding layer, it is possible to suppress interference of a pulse or a DC bias applied to one of the light-shielding layers with respect to a pulse or a DC bias applied to the other light-shielding layer.

It is also preferable that the amplification type solid state imaging device further includes a third light-shielding layer formed in a region between the light-receiving portion and the noise rejection circuit, as a layer below the first light-shielding layer and the second light-shielding layer, so that the third light-shielding layer overlaps partially with the first light-shielding layer and the second light-shielding layer in a direction of thickness of the semiconductor substrate.

According to the embodiment, since the third light-shielding layer can suppress entry of light through a region between the first light-shielding layer and the second light-shielding layer, the light-shielding property can be improved further.

It is also preferable in the amplification type solid state imaging device that the third light-shielding layer has electroconductivity; and wirings are formed so that voltages can be applied separately to the first light-shielding layer and the second light-shielding layer, and also to apply voltages of the same level simultaneously to the second light-shielding layer and the third light-shielding layer.

It is further preferable that an end of the second light-shielding layer and an end of the third light-shielding layer are connected electrically to each other by one of the wirings, and the other end of the second light-shielding layer and the other end of the third light-shielding layer are connected electrically by another wiring.

In the above-mentioned example, it is possible to suppress the voltage lowering caused by the wiring resistance inherent to the second light-shielding layer and the third light-shielding layer, at parts of the second light-shielding layer and the third light-shielding layer separated from the parts applied with the pulse or the DC bias.

It is also preferable in the embodiment that the third light-shielding layer has electroconductivity, and that wirings are provided so as to apply voltages respectively and separately to the first light-shielding layer, the second light-shielding layer and the third light-shielding layer. In this case, the voltage applied to the second light-shielding layer and the voltage applied to the third light-shielding layer can be set separately, and the second light-shielding layer can be used as a shielding layer for the third light-shielding layer.

It is preferable in the amplification type solid state imaging device that the first light-shielding layer and the second light-shielding layer form a continuous light-shielding layer, and it is particularly preferable that the continuous light-shielding layer has electroconductivity. Since no spacing will be formed between the light-shielding layers according to this embodiment, the light shielding property can be improved further so as to improve the effect of suppressing image quality degradation.

First Embodiment

Figure 2:
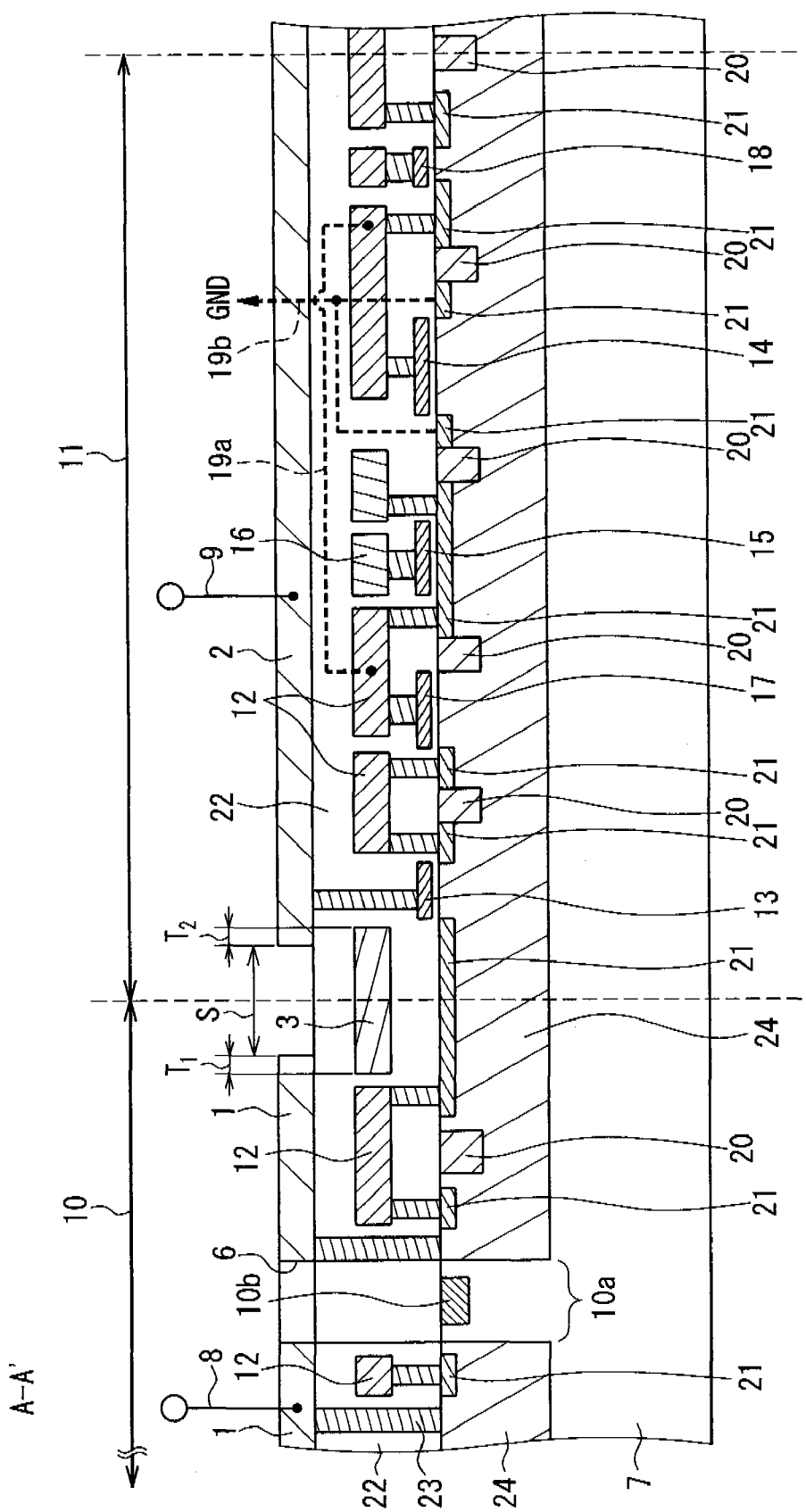
FIG. 2 is a cross-sectional view showing a part of the amplification type solid state imaging device as shown in FIG. 1, which is taken along a line A-A' in FIG. 1.

An amplification type solid state imaging device according to a first embodiment of the present invention will be described below with reference to FIGS. 1 and 2. FIG. 1 is a schematic view showing a layout of an amplification type solid state imaging device in the first embodiment of the present invention. FIG. 2 is a cross-sectional view showing a part of the amplification type solid state imaging device as shown in FIG. 1, which is taken along a line A-A' in FIG. 1. In FIG. 2, a main part of a semiconductor substrate 7 and an insulating layer 22 are not hatched.

As shown in FIG. 1, the amplification type solid state imaging device has a light-receiving portion 10, a reader and a noise rejection circuit 11, and these components are provided on a semiconductor substrate 7. The light-receiving portion 10 is formed by arranging a plurality of pixels on the semiconductor substrate one-dimensionally or two-dimensionally. Each of the pixels is formed of a photoelectric conversion portion 10a for converting incident light to a signal charge and an outputting portion (not shown) for outputting an electric signal corresponding to the amount of the signal charge (see FIG. 11).

In this example, the pixels are arranged two-dimensionally (in a matrix). Furthermore, as shown in FIG. 2, each photoelectric conversion portion 10a includes a photodiode 10b. The outputting portion includes a transfer transistor (not shown) for reading out the signal charge stored in the photodiode 10b, a floating diffusion layer (not shown) for converting the signal charge to a voltage corresponding to the amount of electric charge, a reset transistor (not shown) for resetting the signal charge stored in the floating diffusion layer, and a driving transistor (not shown). The driving transistor forms a source-follower circuit (not shown). The source-follower circuit denotes a circuit that is connected to the floating diffusion layer and performs amplification of the voltage change or impedance conversion.

As shown in FIGS. 1 and 2, a first light-shielding layer 1 is provided on the upper part of the light-receiving portion 10. In the first light-shielding layer 1, a plurality of opening windows 6 are formed so that light enters the respective photoelectric conversion portions 10a. Therefore, light enters only the photoelectric conversion portion 10a of each pixel, while entry of light into another part of each pixel will be restricted. The opening windows 6 are formed by removing the first light-shielding layer 1 partially and selectively.

The reader performs repeatedly an operation of readout in the row direction and in the column direction so as to read out an electric signal (pixel signal) for each pixel. In this example, the reader includes the vertical scanner 5 and the horizontal scanner 4 as shown in FIG. 1 and also vertical signal lines 12, a vertical-signal-line noise-rejection-circuit connection transistor 13 and a horizontal selection transistor 18 as shown in FIG. 2. Though not shown in either FIG. 1 or FIG. 2, the reader includes further switching transistors (not shown) and horizontal signal lines (not shown).

The vertical scanner 5 is provided on the semiconductor substrate 7 along the direction of the pixel columns (vertical direction). The horizontal scanner 4 is provided on the semiconductor substrate 7 along the direction of pixel rows (horizontal direction). The switching transistors are provided for the respective pixels.

Furthermore, the horizontal signal line is provided at a position adjacent to the noise rejection circuit 11 along the row direction, and it is connected to the noise rejection circuit 11 via the horizontal selection transistor 18. Operations of ON/OFF of the horizontal selection transistor 18 are performed by the horizontal scanner 4.

Figure 10:
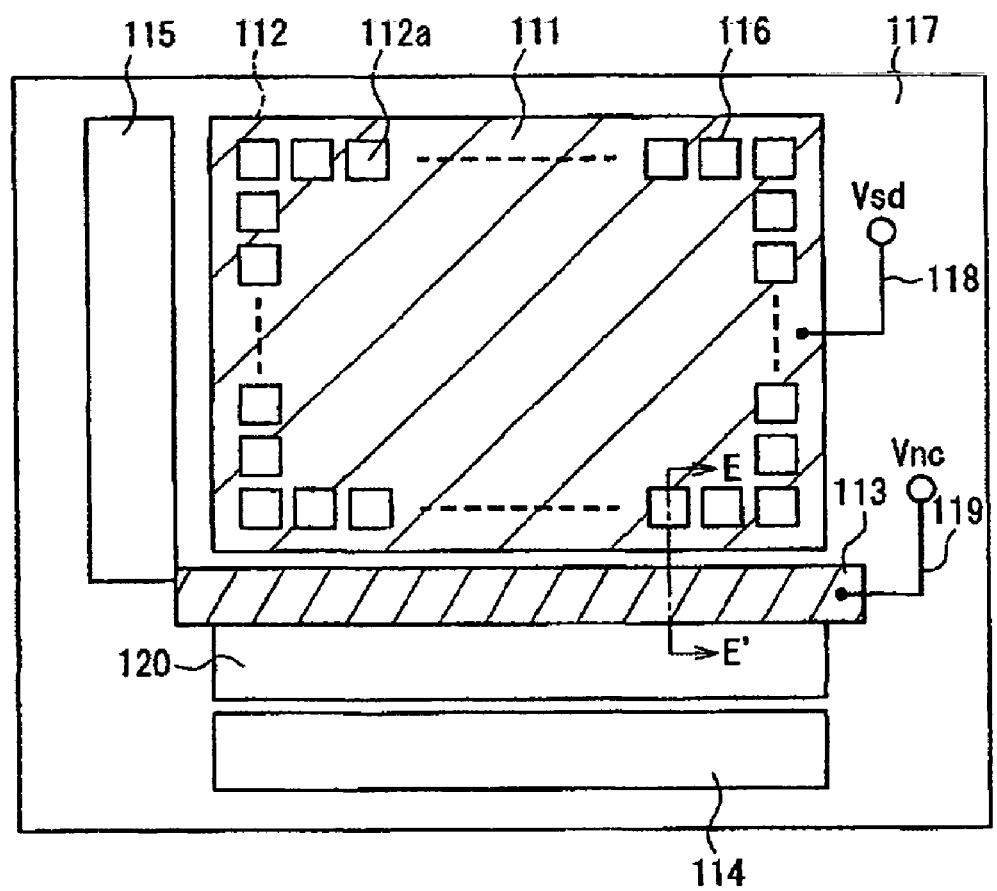
FIG. 10 is a schematic view showing a layout of a conventional amplification type solid state imaging device.
Figure 11A:
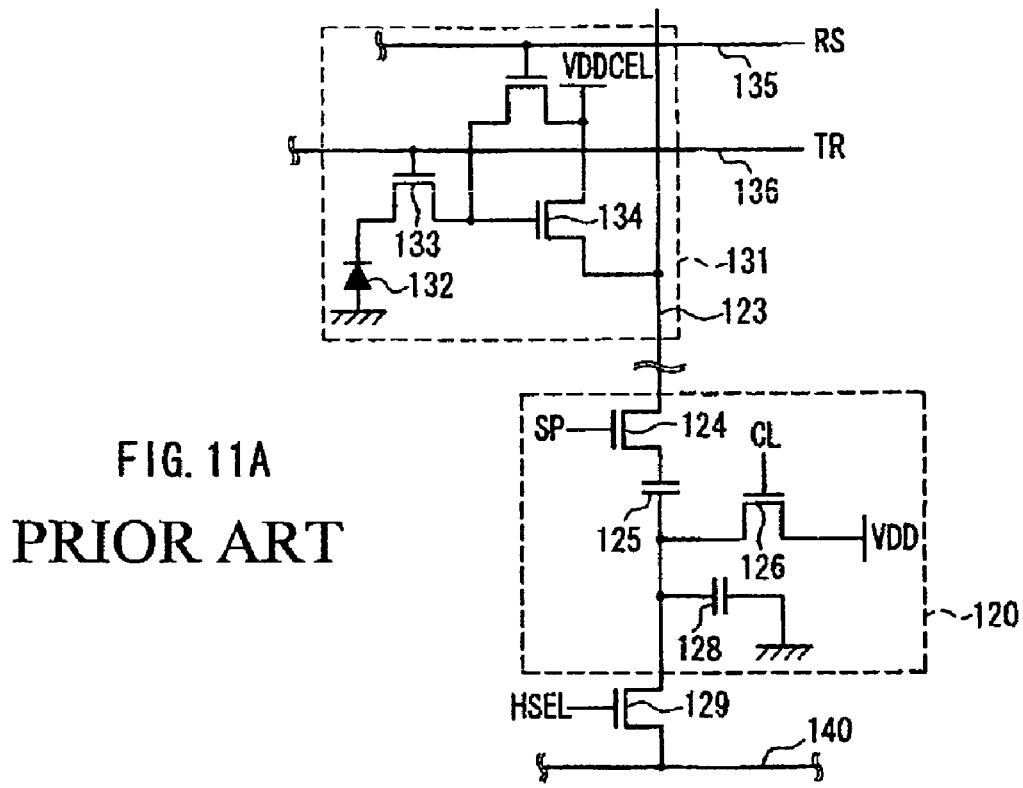
FIGS. 11A and 11B are diagrams showing one example of a unit pixel and a noise rejection circuit.
Figure 11B:
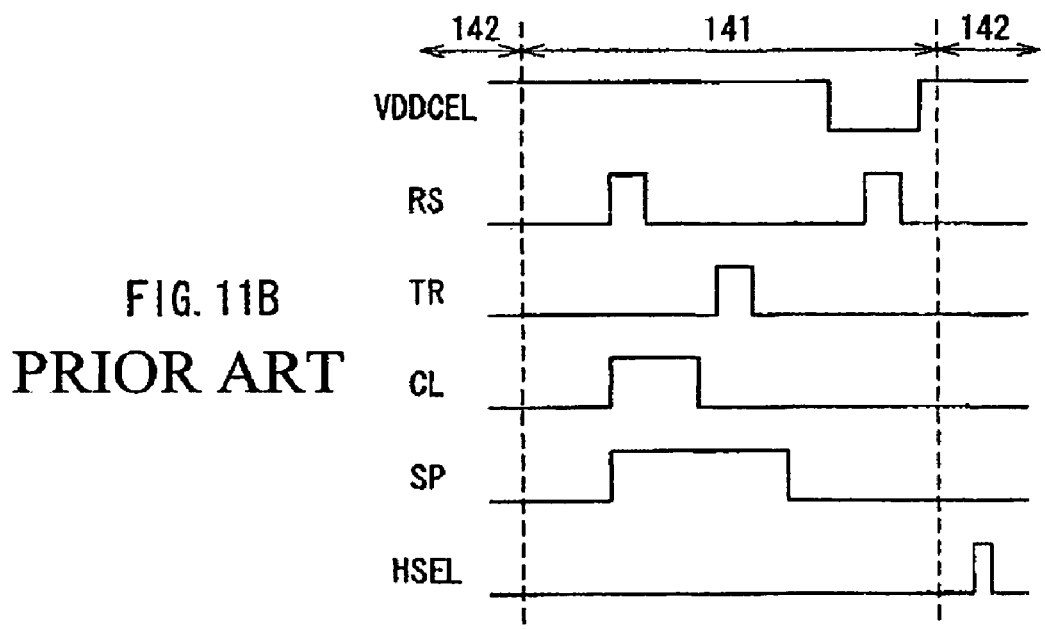
Figure 12:
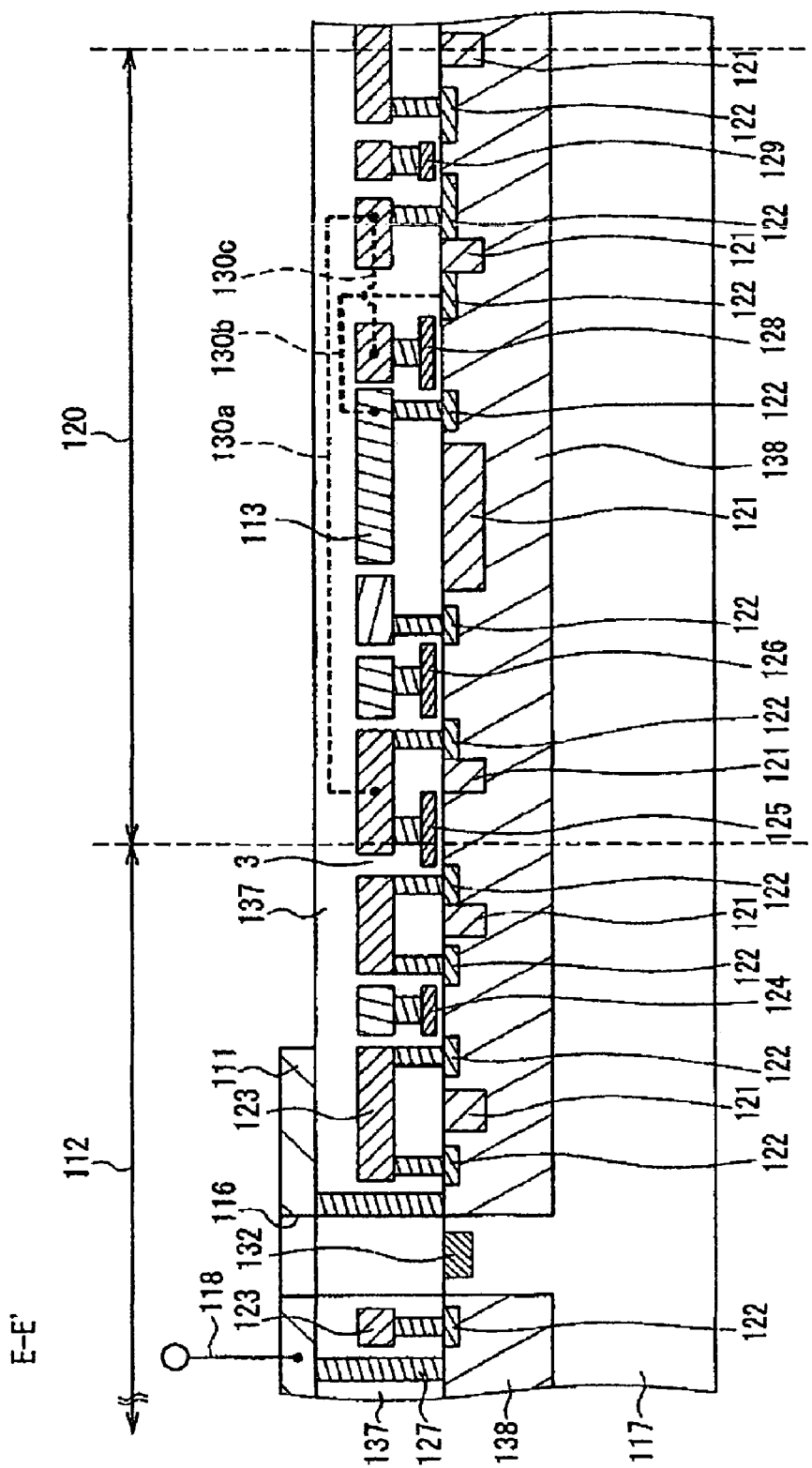
FIG. 12 is a cross-sectional view showing a part of the amplification type solid state imaging device as shown in FIG. 10, which is taken along a line E-E' in FIG. 10.

The noise rejection circuit 11 is substantially the same as the noise rejection circuit 120 as shown in FIGS. 10 and 11. Similarly, the noise rejection circuit 11 is provided in a region between the light-receiving portion 10 and the horizontal scanner 4 on the semiconductor substrate 7, and it performs suppression and rejection of noise (spurious signal suppression) caused by the dispersion of the amplifying transistors (not shown) forming the respective pixels.

The readout operation by the reader will be described below. First, the switching transistor of a predetermined row is turned ON by the vertical scanner 5 for selecting a row direction, and thereby the pixel signal of the predetermined row is read out.

Next, the pixel signal of the row selected and read out by the vertical scanner 5 is outputted to the noise rejection circuit 11 via the vertical signal lines 12 and the vertical-signal-line noise-rejection-circuit connection transistor 13 (see FIG. 2). The vertical-signal-line noise-rejection-circuit connection transistor 13 is used for switching in transmitting signals from the vertical signal line 12 to the noise rejection circuit 11. The signals are transmitted to the noise rejection circuit 11 only when the vertical-signal-line noise-rejection-circuit connection transistor 13 is controlled to be an ON state.

Thereafter, the pixel signal outputted to the noise rejection circuit 11 is outputted for each pixel due to a drive of the horizontal selection transistor 18 by the horizontal scanner 4. The circuit structure and operations of the noise rejection circuit 11 are the same as those of the noise rejection circuit 120 as shown in FIG. 11 regarding the background art.

In FIG. 2, numerals 14, 15, 16 and 17 denote a sampling capacitor, a clamping transistor, a clamping power supply line and a clamping capacitor respectively. Numerals 19$a$ and 19$b$ denote polysilicon wirings laid out in a plane. Furthermore, 20, 21, 22, 23 and 24 denote an element isolation region, an active region, an insulating region, a contact plug and a well respectively. In FIG. 2, parts provided with the same hatching pattern denote parts having substantially the same functions.

As shown in FIGS. 1 and 2, in the first embodiment, a second light-shielding layer 2 is provided on the upper part of the noise rejection circuit 11 in order to restrict the entry of light into the noise rejection circuit 11. Therefore, unlike the amplification type solid state imaging device as shown in FIG. 11 concerning a background art, in the amplification type solid state imaging device according to the first embodiment, the noise rejection circuit 11 is shielded from the exterior.

As a result, in the first embodiment, photoelectric conversion at the PN junction forming the noise rejection circuit 11 is suppressed, and thus degradation in the image quality as described in the background art will be suppressed. As shown in FIG. 1, no light-shielding layer is formed on either the vertical scanner 5 or on the horizontal scanner 4. However, the vertical scanner 5 does not relate to signals directly, and the time for the horizontal scanner 4 to keep signals is extremely short. Therefore, degradation in the image quality will not be caused by light entering these scanners.

In this example, the first light-shielding layer 1 and the second light-shielding layer 2 are electroconductive films formed of electroconductive materials. Examples of the electroconductive materials forming the first light-shielding layer 1 and the second light-shielding layer 2 include aluminum, tungsten silicide and the like. Aluminum is preferred since it can serve to lower the resistance value.

Furthermore, the first light-shielding layer 1 and the second light-shielding layer 2 are formed separately from each other, and insulated electrically from each other. As shown in FIG. 1, a first wiring 8 is connected to the first light-shielding layer 1 and a second wiring 9 different from the first wiring 8 is connected to the second light-shielding layer 2.

Therefore in the first embodiment, the first light-shielding layer 1 and the second light-shielding layer 2 can be used as wiring layers. Furthermore, different pulse signals, DC biases or the like can be applied to these light-shielding layers separately. Since these light-shielding layers are insulated, a voltage applied to the first light-shielding layer and a voltage applied to the second light-shielding layer will not interfere with each other.

In the first embodiment, a power supply voltage (Vsd) for the pixel portion is applied to the first light-shielding layer 1 by the first wiring 8. The voltage (Vsd) is a pulse voltage, and it is applied as an input signal VDDCEL as shown in FIG. 11.

The second light-shielding layer 2 is applied with a voltage (Vnc) for a switching control of the vertical-signal-line noise-rejection-circuit connection transistor 13. The voltage (Vnc) is a pulse voltage as well. The voltage (Vnc) is applied as an input signal SP as shown in FIG. 11. The second light-shielding layer 2 is used for an output control at the time of outputting an electric signal read out by the reader to the noise rejection circuit 11.

When the first light-shielding layer 1 and the second light-shielding layer 2 are provided with electroconductivity in this manner and further insulated from each other, each of the two layers can be regarded as an independent wiring. As a result, the freedom degree in a wiring design in an amplification type solid state imaging device can be improved, and thus the wiring structure can be made small and the design cost can be reduced.

A space S (see FIGS. 1 and 2) secured for insulating the first light-shielding layer 1 and the second light-shielding layer 2 from each other is not limited particularly, but it can be set in a range allowed for a process of forming the light-shielding layers. Though the first light-shielding layer 1 and the second light-shielding layer 2 in the first embodiment are formed by forming one electroconductive film and then etching the film, alternatively the light-shielding layers can be formed by separate processes.

In the first embodiment, at least one individual wiring layer can be provided as an upper and/or lower layer of the first light-shielding layer 1 and the second light-shielding layer 2. In this case, the additional wiring layer can be a single layer or a multi-layer.

As shown in FIGS. 1 and 2, in this example, a third light-shielding layer 3 is provided at a position between the light-receiving portion 10 and the noise rejection circuit 11 and below the first light-shielding layer 1 and the second light-shielding layer 2. The third light-shielding layer 3 is formed so that it overlaps partially with the first light-shielding layer 1 and the second light-shielding layer 2 in the thickness direction of the semiconductor substrate 7.

As a result, since the third light-shielding layer 3 shields even light entering through the spacing between the first light-shielding layer 1 and the second light-shielding layer 2, degradation in the image quality can be suppressed more effectively. The third light-shielding layer 3 can be formed of any of the materials listed as materials for the first light-shielding layer 1 and the second light-shielding layer 2.

The dimensions of the parts of the third light-shielding layer 3 overlapping with the first light-shielding layer 1 and the second light-shielding layer 2 can be set so that light will not enter through the spacing between the first light-shielding layer 1 and the second light-shielding layer isolated from each other. Specifically, it is preferred that both T1 and T2 are set to be 5 μm or more, when T1 denotes a column direction length of the part overlapping with the first light-shielding layer 1, and T2 denotes a column direction length of the part overlapping with the second light-shielding layer 2. When considering the margins or the like required in the producing steps, it is particularly preferable that T1 and T2 are set to be in a range of about 5.5 μm to 8.0 μm.

Second Embodiment

Figure 3:
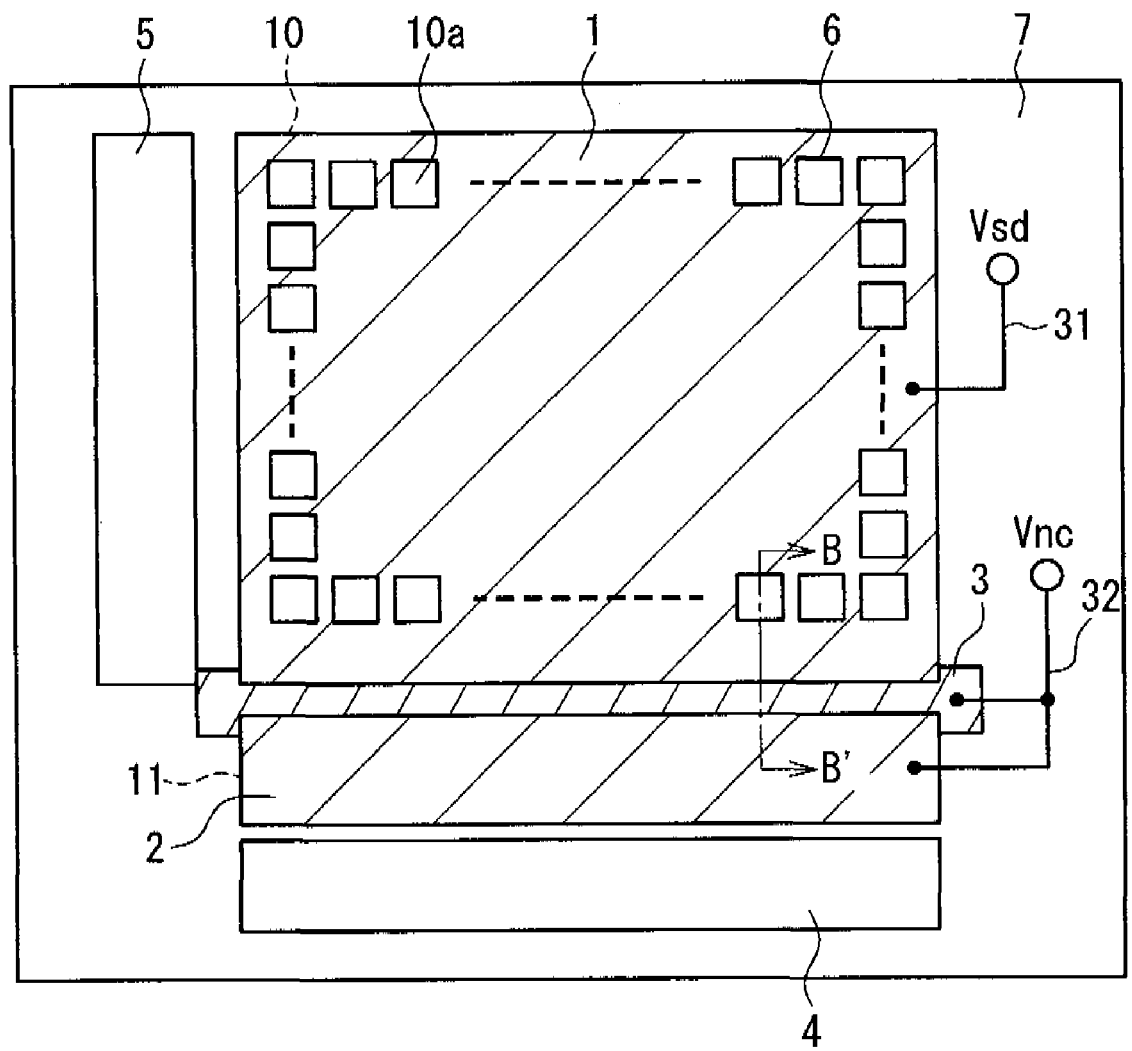
FIG. 3 is a schematic view showing a layout of an amplification type solid state imaging device according to a second embodiment of the present invention.
Figure 4:
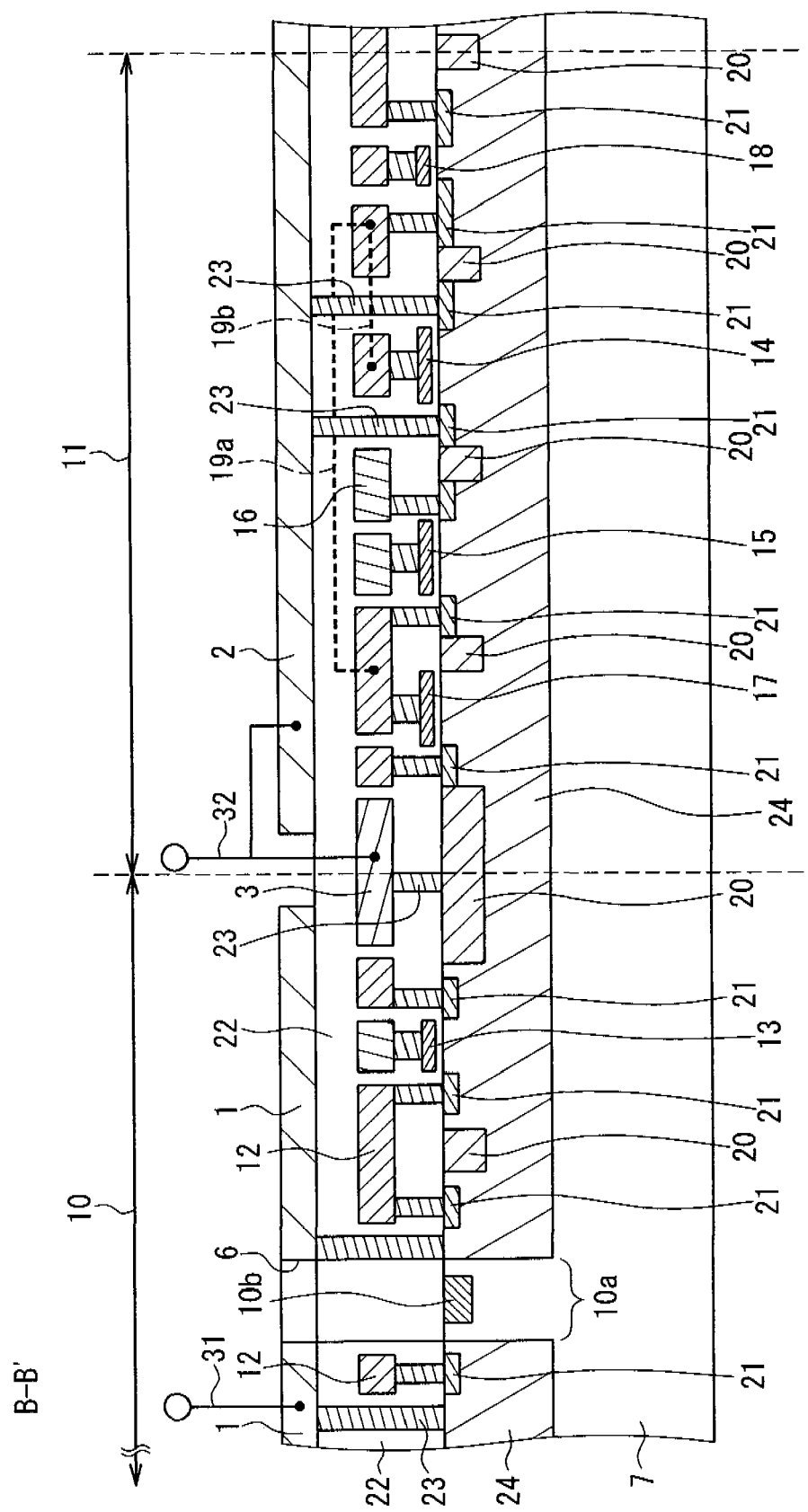
FIG. 4 is a cross-sectional view showing a part of the amplification type solid state imaging device as shown in FIG. 3, which is taken along a line B-B' in FIG. 3.

An amplification type solid state imaging device in a second embodiment of the present invention will be described below with reference to FIGS. 3 and 4. FIG. 3 is a schematic view showing a layout of an amplification type solid state imaging device in the second embodiment of the present invention. FIG. 4 is a cross-sectional view showing a part of the amplification type solid state imaging device as shown in FIG. 3, which is taken along a line B-B' in FIG. 3.

In FIGS. 3 and 4, the same reference numerals are assigned to the same components as in FIG. 1 or FIG. 2. In FIG. 4, a main part of a semiconductor substrate 7 and an insulating layer 22 are not hatched. Furthermore, the parts provided with the same hatching pattern denote parts having substantially the same functions.

Similarly to the first embodiment, a first wiring 31 is connected to a first light-shielding layer 1 in the second embodiment as shown in FIGS. 3 and 4. A second wiring 32 other than the first wiring 31 is connected to the second light-shielding layer 2. Therefore, in the second embodiment, a voltage (Vsd) can be applied to the first light-shielding layer by the first wiring 31, and a voltage (Vnc) can be applied to the second light-shielding layer 2 by the second wiring 32 as well.

Unlike in the first embodiment as shown in FIGS. 1 and 2, the second wiring 32 in the second embodiment is connected also to the third light-shielding layer 3, and thus the second light-shielding layer 2 and the third light-shielding layer 3 can be applied with voltage of the same level simultaneously. Therefore, the voltage (Vnc) can be applied to both the second light-shielding layer 2 and the third light-shielding layer 3.

In the second embodiment, the voltage (Vsd) applied to the first light-shielding layer 1 is a pulse voltage and it is applied as an input signal VDDCEL as shown in FIG. 11. As shown in FIG. 4, the second light-shielding layer 2 is connected to the active region 21 in the vicinity of the sampling capacitor 14 via the contact plug 23. The third light-shielding layer 3 is connected via the contact plug 23 to the element isolation region 20 formed in the semiconductor substrate 7. The voltage (Vnc) applied to the second light-shielding layer 2 and the third light-shielding layer 3 provides a GND to the well 24 and the sampling capacitor 14.

In this manner, in the second embodiment, the second light-shielding layer 2 and the third light-shielding layer 3 can be applied with the same pulse or the same DC bias, while the first light-shielding layer 1 can be applied with a pulse or a DC bias different from the pulse or the DC bias applied to the second light-shielding layer 2 and the third light-shielding layer 3. Except for these features, the amplification type solid state imaging device as shown in FIG. 3 is configured similarly to the amplification type solid state imaging device as shown in FIG. 1.

The noise rejection circuit 11 is formed of a plurality of unit circuits. According to the second embodiment, the respective unit circuits can be miniaturized. Specifically, for stabilizing the potential in one horizontal direction in a conventional amplification type solid state imaging device, one contact for well potential must be formed in a region provided with a unit circuit for each group of unit pixels and unit circuits aligned vertically, in general. When only one wiring layer is connected to the contact for well potential, reduction in the intervals between contacts will be limited by the process rule. In a case of providing a wiring such as a signal line between the contacts, the margin between the wiring and the contact also should be taken into consideration. Due to these factors, the reduction in size of the noise rejection circuit 11 in the horizontal direction has been limited in the conventional amplification type solid state imaging device.

In the second embodiment, however, the well potential can be provided by the third light-shielding layer 3 as well. That is, the well potential can be provided by two wiring layers including the third light-shielding layer 3 and a wiring connected to the contact for well potential. Therefore, according to the second embodiment, the degree of freedom in designing the wiring can be improved. Specifically, it is possible to shift considerably the position of the contact for well potential between the unit circuits corresponding to the unit pixels in odd number columns and the unit circuits corresponding to the unit pixels in even number columns. As a result, the interval between the contacts will be less limited by the process rule, thereby allowing a reduction in the size. Therefore, in the respective unit circuits, the dimensions in the horizontal direction can be reduced so that the unit pixels and the unit circuits can be miniaturized in the horizontal direction.

Third Embodiment

Figure 5:
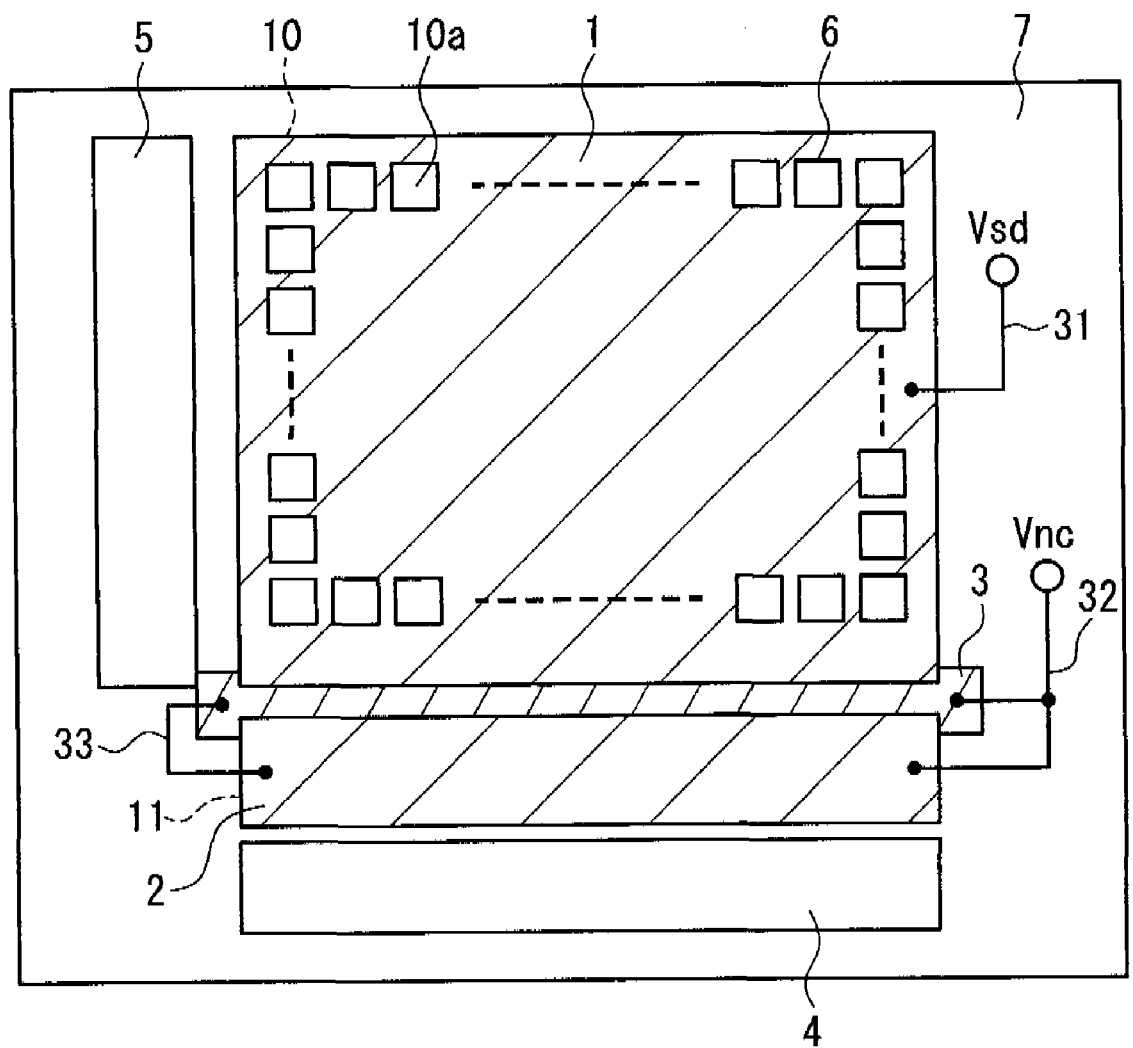
FIG. 5 is a schematic view showing a layout of an amplification type solid state imaging device according to a third embodiment of the present invention.

An amplification type solid state imaging device in a third embodiment of the present invention will be described below with reference to FIG. 5. FIG. 5 is a schematic view showing a layout of an amplification type solid state imaging device in the third embodiment. In FIG. 5, the same reference numerals are assigned to the same elements as in FIG. 1.

Unlike the example as shown in FIG. 3, in the third embodiment as shown in FIG. 5, the second light-shielding layer 2 and the third light-shielding layer 3 are connected electrically by a wiring 33 in addition to the second wiring 32. Except for this feature, the amplification type solid state imaging device as shown in FIG. 5 is configured similarly to the amplification type solid state imaging device as shown in FIG. 3.

Specifically, a second wiring 32 is connected to one end of the second light-shielding layer 2 (right side in the figure) and also to one end of the third light-shielding layer 3 similarly to the example in FIG. 3. Therefore, similarly to the second embodiment as shown in FIG. 3, the same pulse or the same DC bias can be applied to the second light-shielding layer 2 and to the third light-shielding layer 3.

In addition to that, in the third embodiment, the end of the other side of the second light-shielding layer 2 (left side in the figure) and the end of the other side of the third light-shielding layer 3 are connected electrically to each other by a wiring 33 other than the second wiring 32. Actually, the wiring 33 denotes a contact plug provided in the insulating layer 22 (see FIG. 4) between the second light-shielding layer 2 and the third light-shielding layer 3.

As mentioned above, in the third embodiment, the second light-shielding layer 2 and the third light-shielding layer 3 are connected electrically to each other at an area most separated from the other area applied with a pulse or a DC bias in the second light-shielding layer 2 and the third light-shielding layer 3. As a result, according to the third embodiment, it is possible to suppress voltage lowering caused by wiring resistance inherent to the second light-shielding layer 2 and the third light-shielding layer 3, at the area separated from the other area applied with a pulse or a DC bias.

Fourth Embodiment

Figure 6:
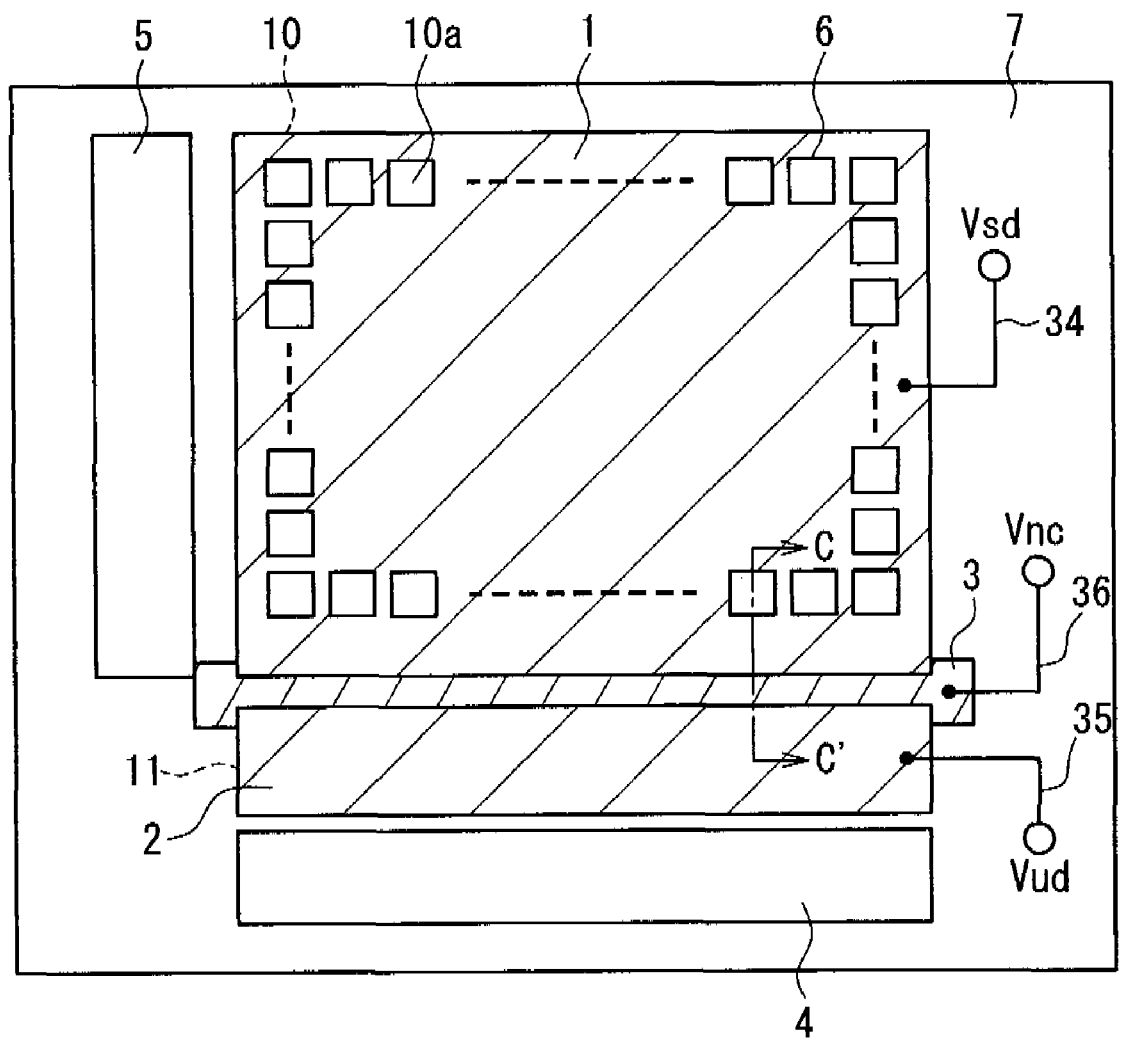
FIG. 6 is a schematic view showing a layout of an amplification type solid state imaging device according to a fourth embodiment of the present invention.
Figure 7:
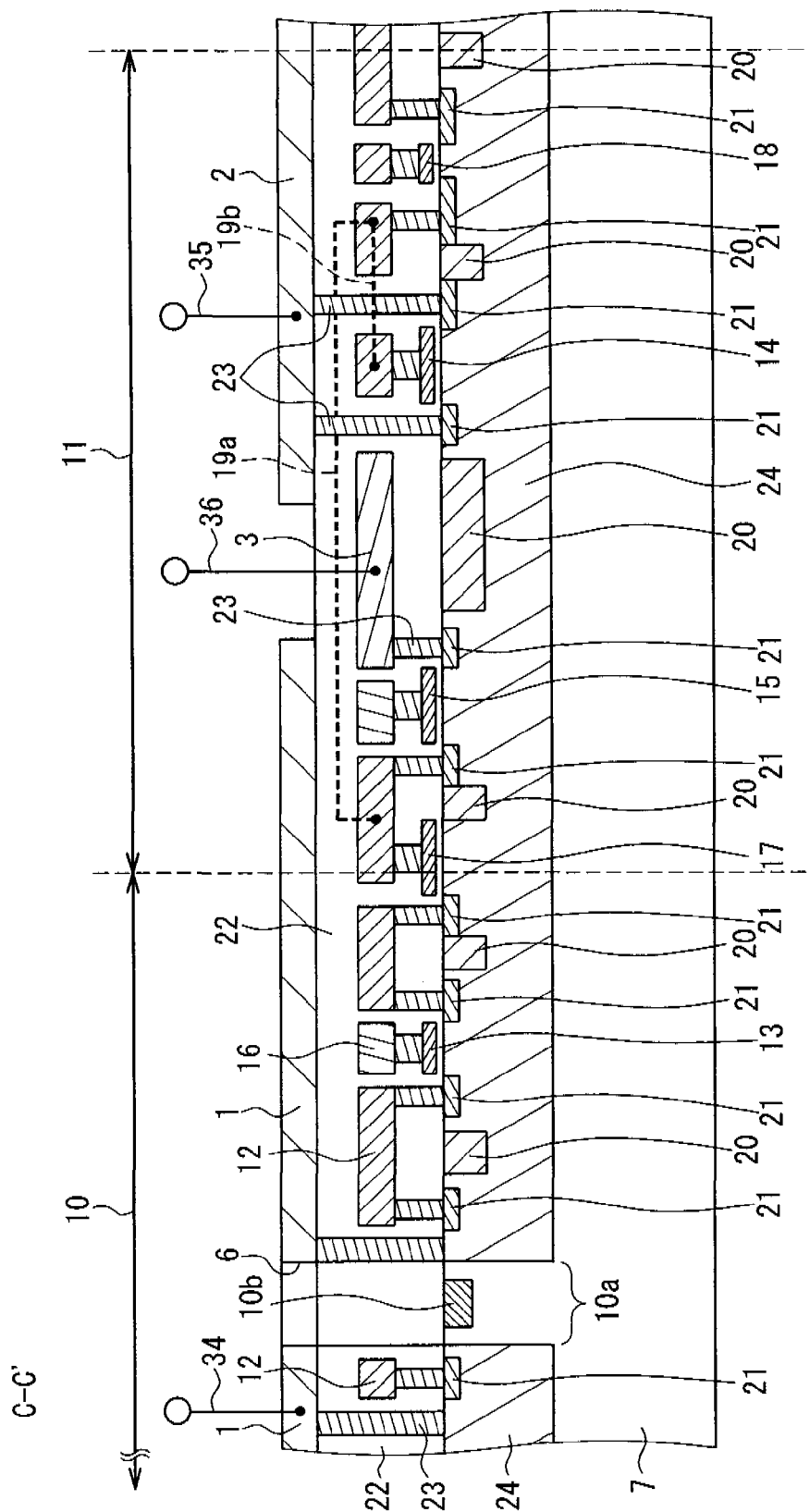
FIG. 7 is a cross-sectional view showing a part of the amplification type solid state imaging device as shown in FIG. 6, which is taken along a line C-C' in FIG. 6.

An amplification type solid state imaging device in a fourth embodiment of the present invention will be described below with reference to FIG. 6. FIG. 6 is a schematic view showing a layout of an amplification type solid state imaging device in the fourth embodiment. FIG. 7 is a cross-sectional view showing a part of the amplification type solid state imaging device as shown in FIG. 6, which is taken along a line C-C' in FIG. 6.

In FIGS. 6 and 7, the same reference numerals are assigned to the same components as in FIG. 1 or FIG. 2. In FIG. 7, a main part of a semiconductor substrate 7 and an insulating layer 22 are not hatched. Furthermore, the parts provided with the same hatching pattern in FIG. 7 denote parts having substantially the same functions.

Similar to the first embodiment as shown in FIGS. 1 and 2, a first wiring 34 in the fourth embodiment as shown in FIGS. 6 and 7 is connected to the first light-shielding layer 1, and a second wiring 35 is connected to the second light-shielding layer 2.

Unlike the first embodiment as shown in FIGS. 1 and 2, a third wiring 36 other than the first wiring 34 and the second wiring 35 is provided in the fourth embodiment. The third wiring 36 is connected to the third light-shielding layer 3. Except for these features, the amplification type solid state imaging device as shown in FIGS. 6 and 7 is configured similarly to the amplification type solid state imaging device as shown in FIG. 1.

Furthermore, as shown in FIG. 6, a voltage (Vsd) is applied to the first light-shielding layer 1 by the first wiring 34, a voltage (Vud) is applied to the second-shielding layer 2 by the second wiring 35, and a voltage (Vnc) is applied to the third light-shielding layer 3 by the third wiring 36.

In the fourth embodiment, the voltage (Vsd) applied to the first light-shielding layer 1 is a pulse voltage, and it is applied as an input signal VDDCEL as shown in FIG. 11. Furthermore, as shown in FIG. 7, the second light-shielding layer 2 is connected to the active region 21 in the vicinity of the sampling capacitor 14 via the contact plug 23. The voltage (Vud) applied to the second light-shielding layer 2 provides a GND to the sampling capacitor 14.

As shown in FIG. 7, in the fourth embodiment, the third light-shielding layer 3 is connected via the contact plug 23 to the active region 21 as a drain region for the clamping transistor 15, and it functions as a clamping power supply line. The voltage (Vnc) to be applied to the third light-shielding layer 3 is applied as an input signal VDD.

As mentioned above, in the fourth embodiment, the second light-shielding layer 2 is connected electrically only to the active region 21 in the vicinity of the sampling capacitor 14, and the wiring width of the second light-shielding layer 2 can be set greater than the wiring width of the third light-shielding layer 3. Therefore, the GND potential of the sampling capacitor 14 can be set uniform in the horizontal direction. As a result, uniformity in horizontal output of the noise rejection circuit 11 can be improved.

For improving the horizontal output uniformity of the noise rejection circuit 11, the clamping voltage applied by the third light-shielding layer 3 is important as well in FIG. 7. In some cases, in comparison with making the GND potential of the sampling capacitor to be uniform in the horizontal direction of the noise rejection circuit 11, making the clamping voltage to be uniform in the horizontal direction is more useful to make the horizontal output of the noise rejection circuit 11 to be uniform. In this case, it is preferable that the second light-shielding layer 2 is connected to the active region 21 as a drain region for the clamping transistor 15, and that GND (Vud) as a reference voltage for the clamping capacitor is applied via the second light-shielding layer 2.

In this manner, in the fourth embodiment, pulses or DC biases can be applied separately to the first light-shielding layer 1, the second light-shielding layer 2 and the third light-shielding layer 3. That is, unlike the second/third embodiment as shown in FIG. 3/5, the voltage to be applied to the second light-shielding layer 2 and the voltage to be applied to the third light-shielding layer 3 can be set separately in the fourth embodiment. Furthermore, since different voltages can be applied to the second light-shielding layer 2 and the third light-shielding layer 3, the wiring width can be adjusted in accordance with the design requirement if necessary.

Fifth Embodiment

Figure 8:
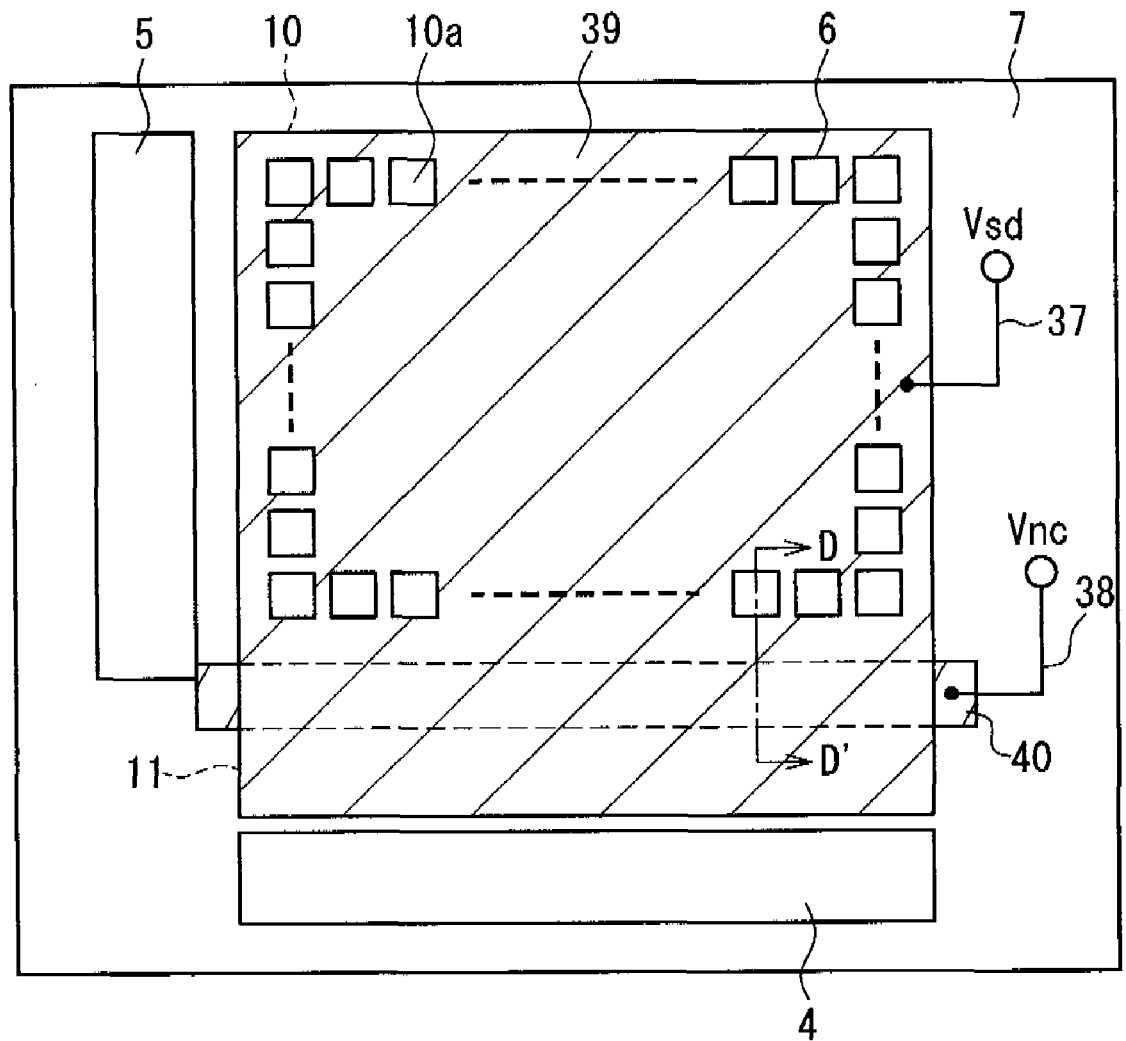
FIG. 8 is a schematic view showing a layout of an amplification type solid state imaging device according to a fifth embodiment of the present invention.
Figure 9:
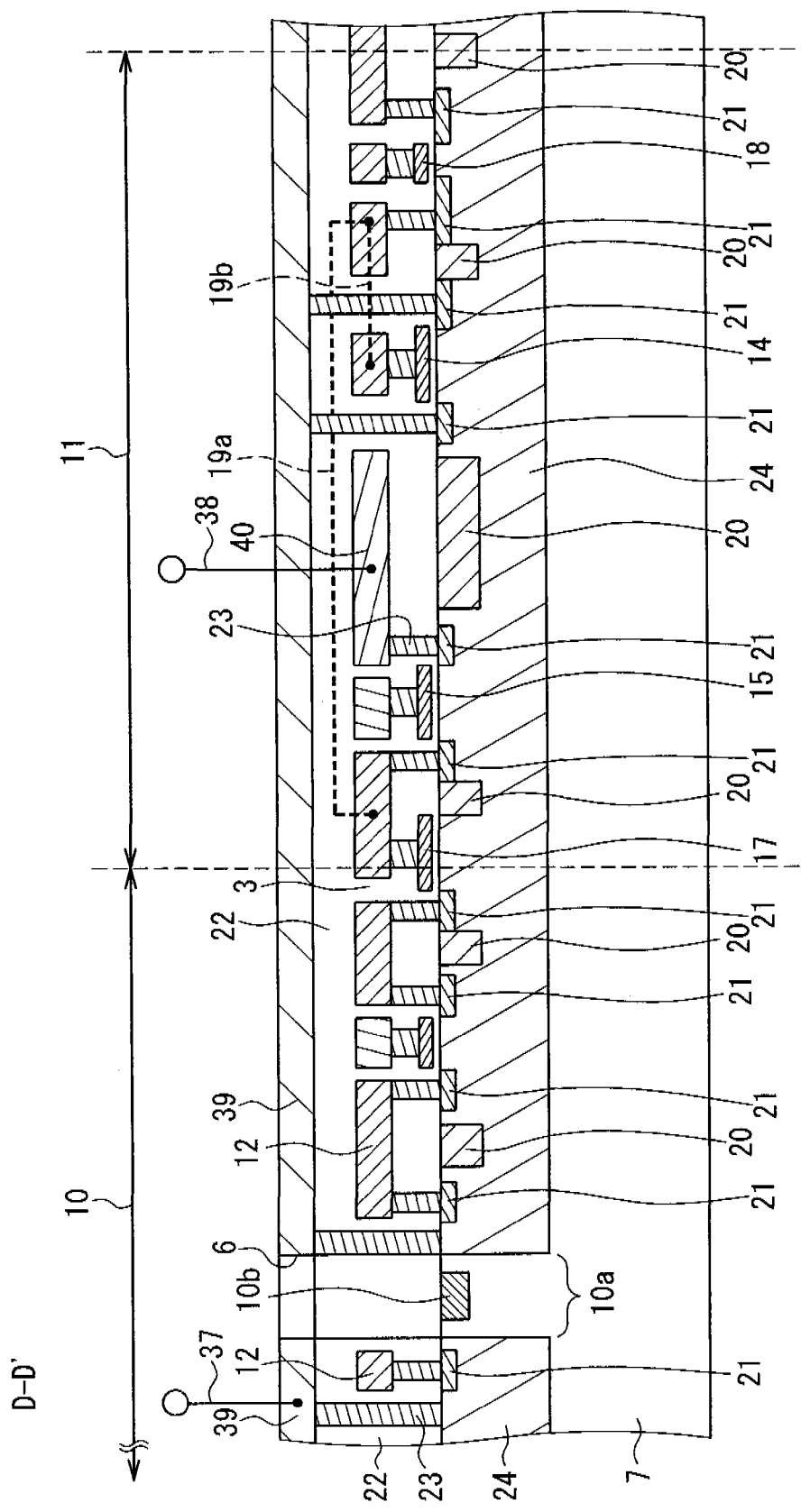
FIG. 9 is a cross-sectional view showing a part of the amplification type solid state imaging device as shown in FIG. 8, which is taken along a line D-D' in FIG. 8.

An amplification type solid state imaging device in a fifth embodiment of the present invention will be described below with reference to FIGS. 8 and 9. FIG. 8 is a schematic view showing a layout of an amplification type solid state imaging device in the fifth embodiment. FIG. 9 is a cross-sectional view showing one part of the amplification type solid state imaging device as shown in FIG. 8, which is taken along a line D-D' in FIG. 8.

In FIGS. 8 and 9, the same reference numerals are assigned to the same components as in FIG. 1 or FIG. 2. In FIG. 9, a main part of a semiconductor substrate 7 and an insulating layer 22 are not hatched. Furthermore, the parts provided with the same hatching patterns as in FIG. 9 denote parts having substantially the same functions.

As shown in FIGS. 8 and 9, the amplification type solid state imaging device in the fifth embodiment includes one continuous light-shielding layer 39 that covers both the light-receiving portion 10 and the noise rejection circuit 11, in place of the first light-shielding layer 1 and the second light-shielding layer 2 as shown in FIG. 1 regarding the first embodiment. Namely, in the fifth embodiment, the first light-shielding layer 1 and the second light-shielding layer 2 as shown in FIG. 1 form one continuous light-shielding layer 39.

Therefore, according to the fifth embodiment, since no spacing will be formed between the light-shielding layers as shown in FIG. 1, the light shielding property can be improved further in comparison with the first embodiment. As a result, it can be expected that the effect of suppressing image quality degradation is improved further than in the first embodiment. Furthermore, there is no need of providing a third light-shielding layer as in the first embodiment.

In the fifth embodiment, the light-shielding layer 39 is formed of an electroconductive material as in the first embodiment. In FIGS. 8 and 9, 40 denotes a wiring layer. Furthermore, a first wiring 37 is connected to the light-shielding layer 39, and a second wiring 38 other than the first wiring 37 is connected to the wiring layer 40.

In the fifth embodiment, the voltage (Vsd) applied to the light-shielding layer 39 is a pulse voltage and it is applied as an input signal VDDCEL as shown in FIG. 11. Furthermore, as shown in FIG. 9, the wiring layer 40 is connected via the contact plug 23 to the active region 21 as a drain region for the clamping transistor 15, and it functions as a clamping power supply line. The voltage (Vnc) applied to the wiring layer 40 is applied as an input signal VDD.

Except for the above-mentioned features, the amplification type solid state imaging device in the fifth embodiment is configured as the amplification type solid state imaging device of the first embodiment as shown in FIG. 1.

INDUSTRIAL APPLICABILITY

As described above, according to the amplification type solid state imaging device of the present invention, the light-shield property is improved in comparison with a conventional amplification type solid state imaging device, thereby improving the image quality. Therefore, the amplification type solid state imaging device of the present invention can be used particularly preferably for an industrial solid-state imaging apparatus, a broadcasting solid-state imaging apparatus, a solid-state imaging apparatus for a professional use and the like, which require improvement in the image quality particularly.

The invention claimed is:

1. An amplification type solid state imaging device comprising:
   a light-receiving portion formed by arranging on a semiconductor substrate one-dimensionally or two-dimensionally a plurality of pixels that convert incident light to signal charge and output electric signals corresponding to the amount of the signal charge,
   a reader for reading out sequentially the electric signals from the respective pixels,
   a noise rejection circuit for suppressing spurious signals for the electric signals read out by the reader, and
   a first light-shielding layer positioned on the upper part of the light-receiving portion so as to restrict entry of tight into the light-receiving portion other than a part for photoelectric conversion;
   wherein a second light-shielding layer for restricting entry of tight into the noise rejection circuit is provided on the upper part of the noise rejection circuit;
   the first light-shielding layer and the second light-shielding layer have electroconductivity,
   wirings are connected to the first light-shielding layer and the second light-shielding layer respectively,
   different signal voltages are applied respectively to the wiring connected to the first light-shielding layer and the wiring connected to the second light-shielding layer; and
   the amplification type solid state imaging device comprises further a third light-shielding layer formed in a spacing between the light-receiving portion and the noise rejection circuit, as a layer below the first light-shielding layer and the second light-shielding layer, so that the third light-shielding layer overlaps partially with the first light-shielding layer and the second light-shielding layer in a direction of thickness of the semiconductor substrate.

2. The amplification type solid state imaging device according to claim 1, wherein the reader has a vertical scanner provided along a column direction of the pixels and a horizontal scanner provided along a row direction of the pixels, the noise rejection circuit is provided in a region between the light-receiving portion and the horizontal scanner on the semiconductor substrate, and the first light-shielding layer and the second light-shielding layer are formed separately from each other.

3. The amplification type solid state imaging device according to claim 1, wherein the second light-shielding layer is used for an output control at the time of outputting the electric signals read out by the reader to the noise rejection circuit.

4. The amplification type solid state imaging device according to claim 1, wherein the third light-shielding layer has electroconductivity, and wirings are formed so as to apply voltages separately to the first light-shielding layer and the second light-shielding layer, and also to apply voltages of the same level simultaneously to the second light-shielding layer and the third light, shielding layer.

5. The amplification type solid state imaging device according to claim 4, wherein an end of the second light-shielding layer and an end of the third light-shielding layer are connected electrically by one of the wirings, and the other end of the second light-shielding layer and the other end of the third light-shielding layer are connected electrically by another wiring.

6. The amplification type solid state imaging device according to claim 1, wherein the third light-shielding layer has electroconductivity, and wirings are provided so as to apply voltages respectively and separately to the first light-shielding layer, the second light-shielding layer and the third light-shielding layer.

7. The amplification type solid state imaging device according to claim 1, wherein the first light-shielding layer and the second light-shielding layer form a continuous light-shielding layer.

8. The amplification type solid state imaging device according to claim 7, wherein the continuous light-shielding layer has electroconductivity.

* * * * *